(12) United States Patent
Chamberlin et al.

(10) Patent No.: US 12,046,703 B2
(45) Date of Patent: *Jul. 23, 2024

(54) WAVELENGTH CONVERTING LAYER PATTERNING FOR LED ARRAYS

(71) Applicant: Lumileds LLC, San Jose, CA (US)

(72) Inventors: Danielle Russell Chamberlin, Belmont, CA (US); Erik Roeling, Son (NL); Daniel Bernardo Roitman, Menlo Park, CA (US); Kentaro Shimizu, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/132,157

(22) Filed: Apr. 7, 2023

(65) Prior Publication Data

US 2023/0253532 A1 Aug. 10, 2023

Related U.S. Application Data

(63) Continuation of application No. 17/591,226, filed on Feb. 2, 2022, now Pat. No. 11,646,396, which is a
(Continued)

(30) Foreign Application Priority Data

Mar. 27, 2018 (EP) ..................... 18164362

(51) Int. Cl.
*H01L 33/50* (2010.01)
*C09K 11/02* (2006.01)
(Continued)

(52) U.S. Cl.
CPC .......... *H01L 33/502* (2013.01); *C09K 11/025* (2013.01); *H01L 33/24* (2013.01);
(Continued)

(58) Field of Classification Search
CPC ....... H01L 33/502; H01L 33/24; H01L 33/32; H01L 33/44; H01L 33/46; H01L 33/501;
(Continued)

(56) References Cited

U.S. PATENT DOCUMENTS 6,410,942 B1 6/2002 Thibeault et al.
6,657,236 B1 12/2003 Thibeault et al.
(Continued)

FOREIGN PATENT DOCUMENTS

CN 104821364 A 8/2015
CN 107170876 A 9/2017
(Continued)

OTHER PUBLICATIONS

Allonas et al., "Quaternary ammonium salts of phenylglyoxylic acid as photobase generators for thiol-promoted epoxide phogopolymerization," Polym. Chem., 2014, 5, 6577-6583 (2014).
(Continued)

*Primary Examiner* — Seung C Sohn

(57) ABSTRACT

A method includes depositing a layer comprising a photoinitiator and a curable material onto a surface and applying a nanoimprint mold on the layer of curable material to form a mesh comprising intersecting walls defining cavities. After applying the nanoimprint mold, the mesh is illuminated with light causing decarboxylation of the photoinitiator to initiate curing of the curable material. After curing the curable material, the nanoimprint mold is removed and a wavelength converting material is deposited in the cavities to form an array of wavelength converting pixels.

20 Claims, 14 Drawing Sheets

Related U.S. Application Data continuation of application No. 17/096,010, filed on Nov. 12, 2020, now Pat. No. 11,276,805, which is a continuation of application No. 16/226,616, filed on Dec. 19, 2018, now Pat. No. 10,879,431.

(60) Provisional application No. 62/609,440, filed on Dec. 22, 2017.

(51) Int. Cl.
    H01L 25/075    (2006.01)
    H01L 33/24    (2010.01)
    H01L 33/32    (2010.01)
    H01L 33/44    (2010.01)
    H01L 33/46    (2010.01)

(52) U.S. Cl.
CPC .............. *H01L 33/32* (2013.01); *H01L 33/44* (2013.01); *H01L 33/46* (2013.01); *H01L 33/501* (2013.01); *H01L 33/505* (2013.01); H01L 25/0753 (2013.01); H01L 2933/0041 (2013.01); H01L 2933/0091 (2013.01)

(58) Field of Classification Search
CPC .............. H01L 33/505; H01L 25/0753; H01L 2933/0041; H01L 2933/0091; C09K 11/025
See application file for complete search history.

(56) References Cited

U.S. PATENT DOCUMENTS

| | | | |
|---|---|---|---|
| 6,821,804 B2 | 11/2004 | Thibault et al. | |
| 7,859,006 B2 | 12/2010 | Kato et al. | |
| 7,875,533 B2 | 1/2011 | Epler et al. | |
| 8,384,984 B2 | 2/2013 | Maxik et al. | |
| 8,865,489 B2 | 10/2014 | Rogers et al. | |
| 9,112,112 B2 | 8/2015 | Do et al. | |
| 9,192,290 B2 | 11/2015 | Spinnler et al. | |
| 9,447,932 B2 | 9/2016 | An et al. | |
| 9,496,465 B2 | 11/2016 | Sugimoto et al. | |
| 9,507,204 B2 | 11/2016 | Pelka et al. | |
| 9,599,293 B2 | 3/2017 | Hikmet et al. | |
| 9,722,160 B2 | 8/2017 | Nakabayashi | |
| 9,871,167 B2 | 1/2018 | Moran et al. | |
| 9,887,184 B2 | 2/2018 | Takeya et al. | |
| 9,945,526 B2 | 4/2018 | Singer et al. | |
| 9,978,727 B2 | 5/2018 | Takeya et al. | |
| 9,991,668 B2 * | 6/2018 | Yamashita | H01S 5/0087 |
| 9,997,688 B2 | 6/2018 | Takeya et al. | |
| 10,002,928 B1 | 6/2018 | Raring et al. | |
| 10,018,325 B2 | 7/2018 | Kim et al. | |
| 10,050,026 B2 | 8/2018 | Takeya et al. | |
| 10,145,518 B2 | 12/2018 | Do et al. | |
| 10,734,543 B2 | 8/2020 | Schricker et al. | |
| 10,879,431 B2 | 12/2020 | Chamberlin et al. | |
| 11,646,396 B2 | 5/2023 | Chamberlin et al. | |
| 2006/0202105 A1 | 9/2006 | Krames et al. | |
| 2010/0291374 A1 | 11/2010 | Akarsu et al. | |
| 2011/0068321 A1 | 3/2011 | Pickett et al. | |
| 2013/0140591 A1 | 6/2013 | Tseng et al. | |
| 2014/0094878 A1 | 4/2014 | Gossler et al. | |
| 2014/0307442 A1 * | 10/2014 | Ting | F21K 9/64 362/293 |
| 2015/0228873 A1 | 8/2015 | Gebuhr et al. | |
| 2016/0190400 A1 | 6/2016 | Jung et al. | |
| 2016/0293811 A1 | 10/2016 | Hussell et al. | |
| 2016/0312089 A1 | 10/2016 | Kouno et al. | |
| 2017/0098746 A1 | 4/2017 | Bergmann et al. | |
| 2017/0243860 A1 | 8/2017 | Hong et al. | |
| 2017/0293065 A1 | 10/2017 | Kim | |
| 2017/0358563 A1 | 12/2017 | Cho et al. | |
| 2017/0358724 A1 | 12/2017 | Shichijo et al. | |
| 2018/0019369 A1 | 1/2018 | Cho et al. | |
| 2018/0019373 A1 | 1/2018 | Lehnhardt et al. | |
| 2018/0061316 A1 | 3/2018 | Shin et al. | |
| 2018/0074372 A1 | 3/2018 | Takeya et al. | |
| 2018/0090540 A1 | 3/2018 | Von Malm et al. | |
| 2018/0138157 A1 | 5/2018 | Im et al. | |
| 2018/0145059 A1 | 5/2018 | Welch et al. | |
| 2018/0149328 A1 | 5/2018 | Cho et al. | |
| 2018/0156406 A1 | 6/2018 | Feil et al. | |
| 2018/0166470 A1 | 6/2018 | Chae | |
| 2018/0174519 A1 | 6/2018 | Kim et al. | |
| 2018/0174931 A1 | 6/2018 | Henley | |
| 2018/0210282 A1 | 6/2018 | Song et al. | |
| 2018/0238511 A1 | 8/2018 | Hartmann et al. | |
| 2018/0259137 A1 | 9/2018 | Lee et al. | |
| 2018/0259570 A1 | 9/2018 | Henley | |
| 2018/0272605 A1 | 9/2018 | Gmeinwieser et al. | |
| 2018/0283642 A1 | 10/2018 | Liao et al. | |
| 2018/0297510 A1 | 10/2018 | Fiederling et al. | |
| 2018/0339643 A1 | 11/2018 | Kim | |
| 2018/0339644 A1 | 11/2018 | Kim | |
| 2018/0354406 A1 | 12/2018 | Park | |
| 2021/0083151 A1 | 3/2021 | Chamberlin | |

FOREIGN PATENT DOCUMENTS

| | | |
|---|---|---|
| EP | 3410002 A1 | 12/2018 |
| EP | 3410003 A1 | 12/2018 |
| JP | 2016066765 A | 4/2016 |
| KR | 20140118466 A | 10/2014 |
| KR | 20170018687 A | 2/2017 |
| KR | 20180010670 A | 1/2018 |
| KR | 20180114413 A | 10/2018 |
| TW | 201229574 A | 7/2012 |
| TW | 201501366 A | 1/2015 |
| WO | 2017102708 A1 | 6/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |

OTHER PUBLICATIONS

Arimitsu et al., "Application to Photoreactive Materials of Photochemical Generation of Superbases with High Efficiency Based on Photodecarboxylation Reactions," Chem. Mater., 25 (22), pp. 4461-4463 (2013).

Francolon et al., "Luminescent PVP/SiO2@YAG:Tb3+ composite films," Ceramics International, Elsevier Science, vol. 41, No. 9, pp. 11272-11278 (2015).

Yoon, "Various nanofabrication approaches towards two-dimensional photonic crystals for ceramic plate phosphor-capped white light-emitting diodes," Journal of Materials Chemistry C, Issue 36 (2014).

Chang, "Performance of white light emitting diodes prepared by casting wavelength-converting polymer on InGaN devices," Journal of Applied Polymer Science (2017).

From the EPO as the ISA, International Search Report corresponding to PCT/US2018/066963 dated Dec. 22, 2017, 5 pages.

From the EPO as the ISA, Written Opinion of the International Searching Authority corresponding to PCT/US2018/066963 dated Dec. 22, 2017, 8 pages.

* cited by examiner

WAVELENGTH CONVERTING LAYER PATTERNING FOR LED ARRAYS

CROSS-REFERENCE TO RELATED APPLICATIONS

This application is a continuation of U.S. patent application Ser. No. 17/591,226 filed Feb. 2, 2022, which is a continuation of U.S. patent application Ser. No. 17/096,010 filed Nov. 12, 2020, now U.S. Pat. No. 11,276,805, which is a continuation of U.S. patent application Ser. No. 16/226,616 filed Dec. 19, 2018, now U.S. Pat. No. 10,879,431, which claims benefit of priority to U.S. provisional patent application 62/609,440 filed Dec. 22, 2017 and to European Patent Application EP18164362.8 filed Mar. 27, 2018. Each of the above-mentioned applications is incorporated herein by reference in its entirety.

BACKGROUND

Precision control lighting applications can require the production and manufacturing of light emitting diode (LED) pixel systems. Manufacturing such LED pixel systems can require accurate deposition of material due to the small size of the pixels and the small lane space between the systems. The miniaturization of components used for such LED pixel systems may lead to unintended effects that are not present in larger LED pixel systems.

Semiconductor light-emitting devices including LEDs, resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices are often formed as inverted or flip chip devices, where both the n- and p-contacts formed on the same side of the semiconductor structure, and most of the light is extracted from the side of the semiconductor structure opposite the contacts.

SUMMARY

A method for making a patterned wavelength converting layer includes depositing a layer comprising a photoinitiator and a curable material onto a surface and applying a nanoimprint mold on the layer of curable material to form a mesh comprising intersecting walls defining cavities. After applying the nanoimprint mold, the mesh is illuminated with light causing decarboxylation of the photoinitiator to initiate curing of the curable material. After curing the curable material, the nanoimprint mold is removed and a wavelength converting material is deposited in the cavities to form an array of wavelength converting pixels.

BRIEF DESCRIPTION OF THE DRAWINGS

A more detailed understanding may be had from the following description, given by way of example in conjunction with the accompanying drawings wherein.

DETAILED DESCRIPTION

Figure 1A:
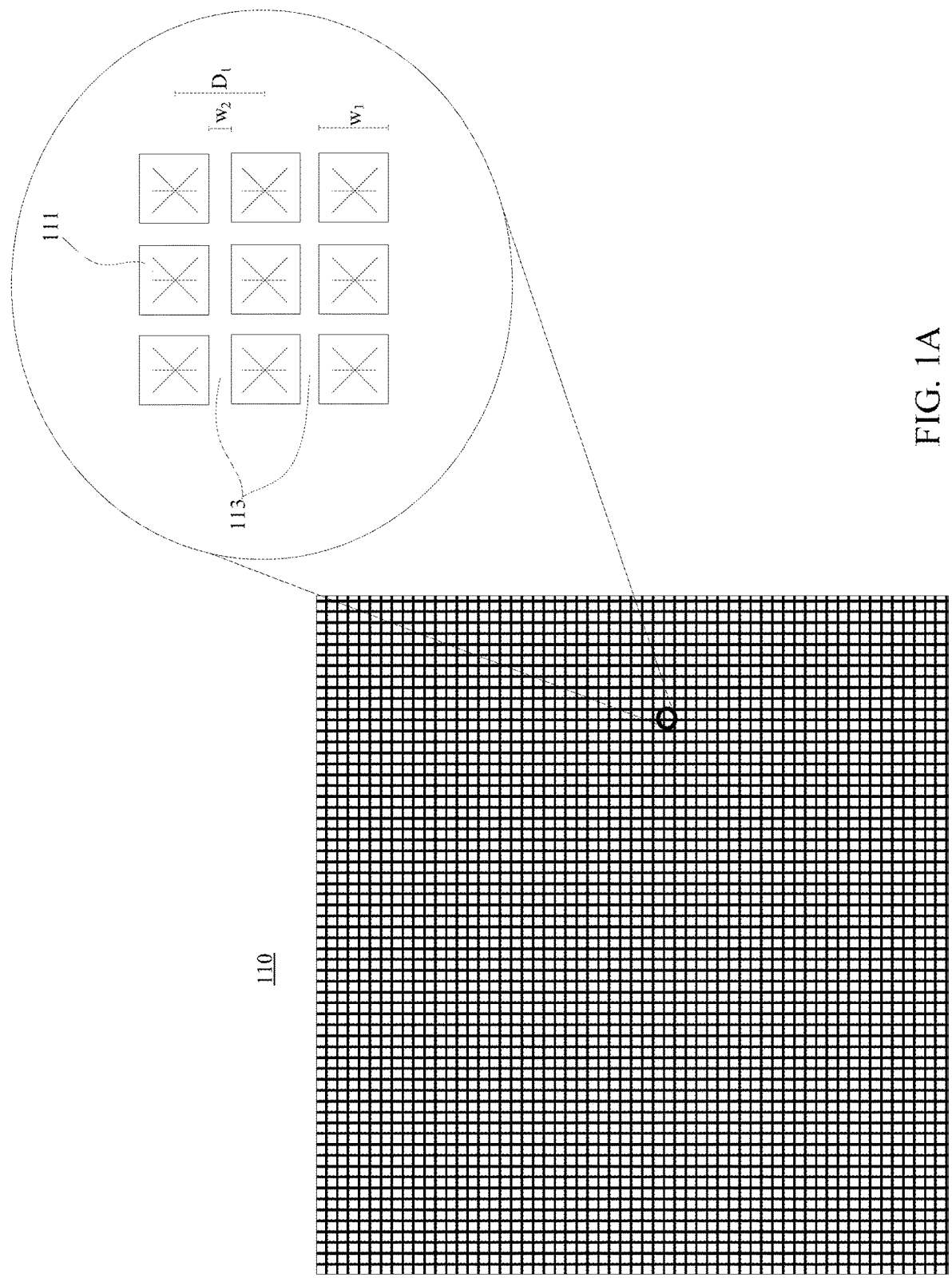
FIG. 1A is a top view diagram of a 3×3 pixel matrix.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

According to embodiments of the disclosed subject matter, LED arrays (e.g., micro LED arrays) may include an array of pixels as shown in FIGS. 1A, 1, and/or 1C. LED arrays may be used for any applications such as those requiring precision control of LED array segments. Pixels in an LED array may be individually addressable, may be addressable in groups/subsets, or may not be addressable. In FIG. 1A, a top view of a LED array 110 with pixels 111 is shown. An exploded view of a 3×3 portion of the LED array 110 is also shown in FIG. 1A. As shown in the 3×3 portion exploded view, LED array 110 may include pixels 111 with a width $w_1$ of approximately 100 μm or less (e.g., 40 μm). The lanes 113 between the pixels may be separated by a width, $w_2$, of approximately 20 μm or less (e.g., 5 μm). The lanes 113 may provide an air gap between pixels or may contain other material, as shown in FIGS. 1B and 1C and further disclosed herein. The distance di from the center of one pixel 111 to the center of an adjacent pixel 111 may be approximately 120 μm or less (e.g., 45 μm). It will be understood that the widths and distances provided herein are examples only, and that actual widths and/or dimensions may vary.

It will be understood that although rectangular pixels arranged in a symmetric matrix are shown in FIGS. 1A, B and C, pixels of any shape and arrangement may be applied to the embodiments disclosed herein. For example, LED array 110 of FIG. 1A may include, over 10,000 pixels in any applicable arrangement such as a 100×100 matrix, a 1200×50 matrix, a symmetric matrix, a non-symmetric matrix, or the like. It will also be understood that multiple sets of pixels, matrixes, and/or boards may be arranged in any applicable format to implement the embodiments disclosed herein.

Figure 1B:
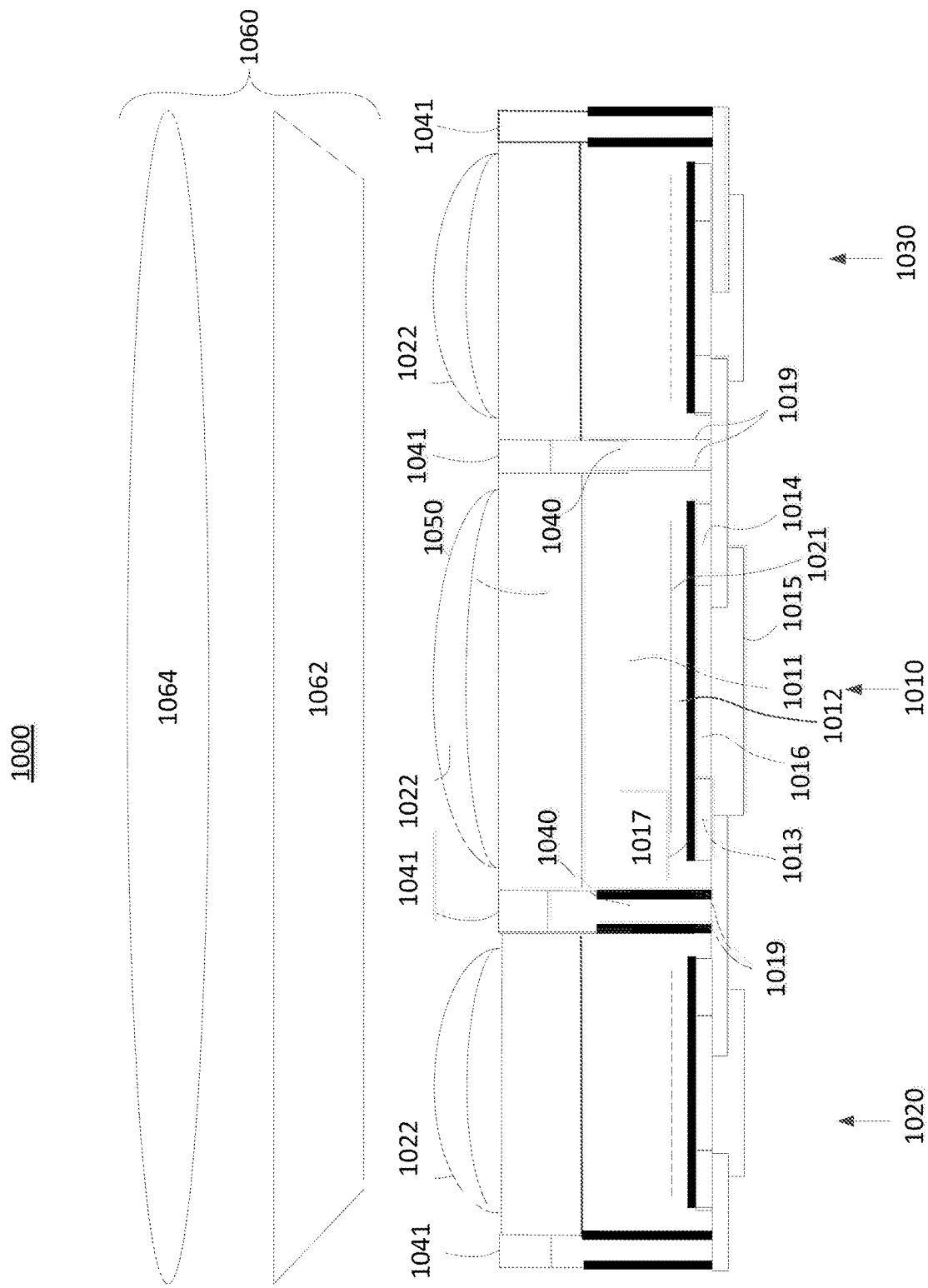
FIG. 1B is a top view diagram of a 10×10 pixel matrix.

FIG. 1B shows a cross section view of an example LED array 1000. As shown, the pixels 1010, 1020, and 1030 correspond to three different pixels within an LED array such that a separation sections 1041 and/or n-type contacts 1040 separate the pixels from each other. According to an embodiment, the space between pixels may be occupied by an air gap. As shown, pixel 1010 includes an epitaxial layer 1011 which may be grown on any applicable substrate such as, for example, a sapphire substrate, which may be removed from the epitaxial layer 1011. A surface of the growth layer distal from contact 1015 may be substantially planar or may be patterned. A p-type region 1012 may be located in proximity to a p-contact 1017. An active region 1021 may be disposed adjacent to the n-type region and a p-type region 1012. Alternatively, the active region 1021 may be between a semiconductor layer or n-type region and p-type region 1012 and may receive a current such that the active region 1021 emits light beams. The p-contact 1017 may be in contact with SiO2 layers 1013 and 1014 as well as plated metal layer 1016 (e.g., plated copper). The n type contacts 1040 may include an applicable metal such as Cu. The metal layer 1016 may be in contact with a contact 1015 which may be reflective.

Notably, as shown in FIG. 1B, the n-type contact 1040 may be deposited into trenches 1130 created between pixels 1010, 1020, and 1030 and may extend beyond the epitaxial layer. Separation sections 1041 may separate all (as shown) or part of a wavelength converting layer 1050. It will be understood that a LED array may be implemented without such separation sections 1041 or the separation sections 1041 may correspond to an air gap. The separation sections 1041 may be an extension of the n-type contacts 1040, such that, separation sections 1041 are formed from the same material as the n-type contacts 1040 (e.g., copper). Alternatively, the separation sections 1041 may be formed from a material different than the n-type contacts 1040. According to an embodiment, separation sections 1041 may include reflective material. The material in separation sections 1041 and/or the n-type contact 1040 may be deposited in any applicable manner such as, for example, but applying a mesh structure which includes or allows the deposition of the n-type contact 1040 and/or separation sections 1041. Wavelength converting layer 1050 may have features/properties similar to wavelength converting layer 205 of FIG. 1D. As noted herein, one or more additional layers may coat the separation sections 1041. Such a layer may be a reflective layer, a scattering layer, an absorptive layer, or any other applicable layer. One or more passivation layers 1019 may fully or partially separate the n-contact 1040 from the epitaxial layer 1011.

The epitaxial layer 1011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 1200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Similarly, the p-type region 1012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 1050 (e.g., phosphor converted LED, "PCLED", etc.) that acts to further modify wavelength of the emitted light to output a light of a second wavelength.

Although FIG. 1B shows an example LED array 1000 with pixels 1010, 1020, and 1030 in an example arrangement, it will be understood that pixels in an LED array may be provided in any one of a number of arrangements. For example, the pixels may be in a flip chip structure, a vertical injection thin film (VTF) structure, a multi-junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 1050 may be in the path of light emitted by active region 1021, such that the light emitted by active region 1021 may traverse through one or more intermediate layers (e.g., a photonic layer). According to embodiments, wavelength converting layer 1050 or may not be present in LED array 1000. The wavelength converting layer 1050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 1050 may be determined based on the material used or application/wavelength for which the LED array 1000 or individual pixels 1010, 1020, and 1030 is/are arranged. For example, a wavelength converting layer 1050 may be approximately 20 μm, 50 μm or 1200 μm. The wavelength converting layer 1050 may be provided on each individual pixel, as shown, or may be placed over an entire LED array 1000.

Primary optic 1022 may be on or over one or more pixels 1010, 1020, and/or 1030 and may allow light to pass from the active region 101 and/or the wavelength converting layer 1050 through the primary optic. Light via the primary optic may generally be emitted based on a Lambertian distribution pattern such that the luminous intensity of the light emitted via the primary optic 1022, when observed from an ideal diffuse radiator, is directly proportional to the cosine of the angle between the direction of the incident light and the surface normal. It will be understood that one or more properties of the primary optic 1022 may be modified to produce a light distribution pattern that is different than the Lambertian distribution pattern.

Secondary optics which include one or both of the lens 1065 and waveguide 1062 may be provided with pixels 1010, 1020, and/or 1030. It will be understood that although secondary optics are discussed in accordance with the example shown in FIG. 1B with multiple pixels, secondary optics may be provided for single pixels. Secondary optics may be used to spread the incoming light (diverging optics), or to gather incoming light into a collimated beam (collimating optics). The waveguide 1062 may be coated with a dielectric material, a metallization layer, or the like and may be provided to reflect or redirect incident light. In alternative embodiments, a lighting system may not include one or more of the following: the wavelength converting layer 1050, the primary optics 1022, the waveguide 1062 and the lens 1065.

Lens 1065 may be formed from any applicable transparent material such as, but not limited to SiC, aluminum oxide, diamond, or the like or a combination thereof. Lens 1065 may be used to modify the a beam of light to be input into the lens 1065 such that an output beam from the lens 1065 will efficiently meet a desired photometric specification. Additionally, lens 1065 may serve one or more aesthetic purpose, such as by determining a lit and/or unlit appearance of the multiple LED devices 1200B.

Figure 1C:
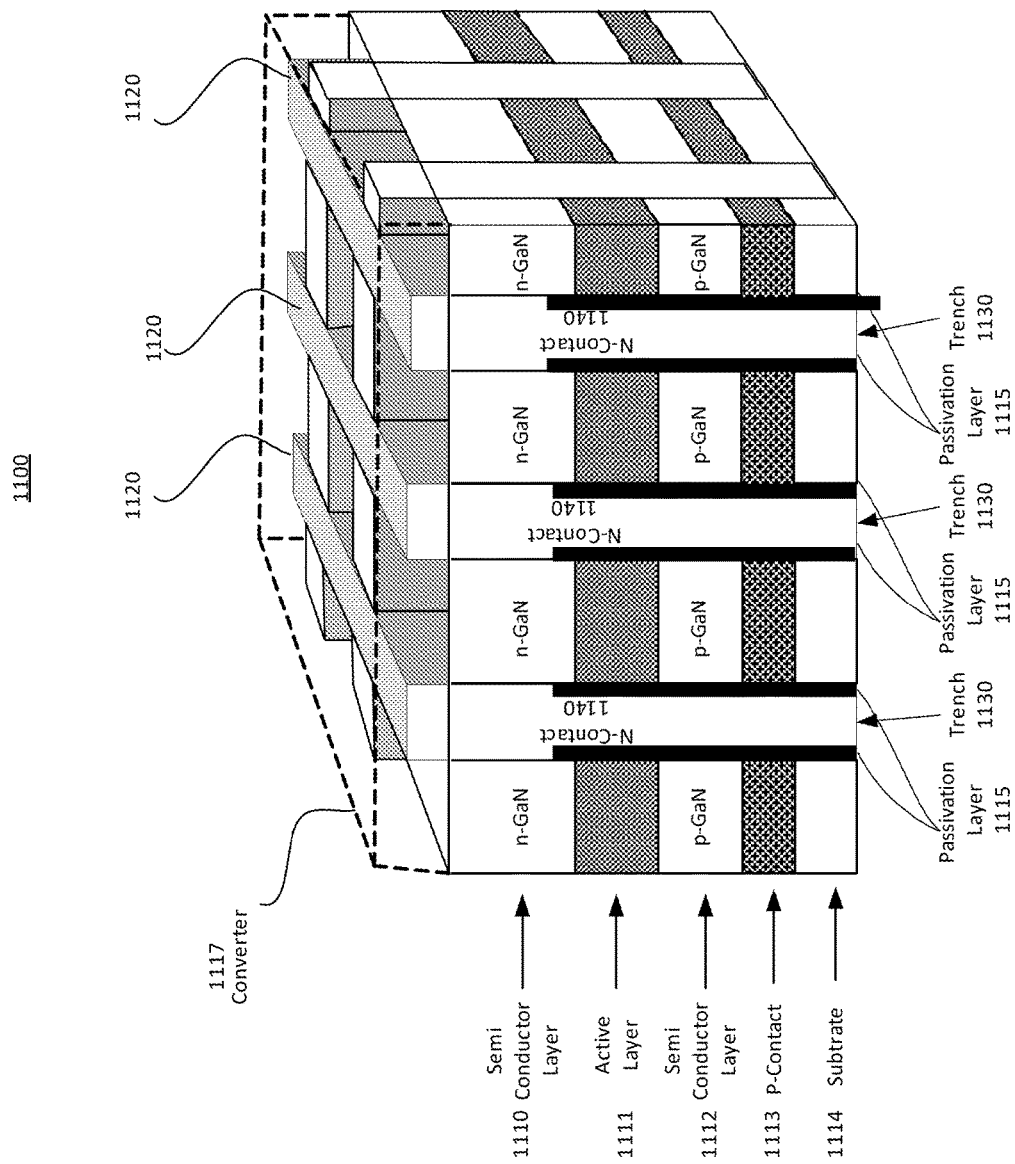
FIG. 1C is a diagram of a 3×3 pixel matrix on a sapphire substrate.

FIG. 1C shows a cross section of a three dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-Gan semiconductor layer 1110. It will be understood that this structure is provided as an example only and one or more semiconductor or other applicable layers may be added, removed, or partially added or removed to implement the disclosure provided herein. A wavelength converting layer 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the wavelength converting layer 1117 such that the n-contacts 1140, or other applicable material, provide complete or partial optical isolation between the pixels.

Figure 1D:
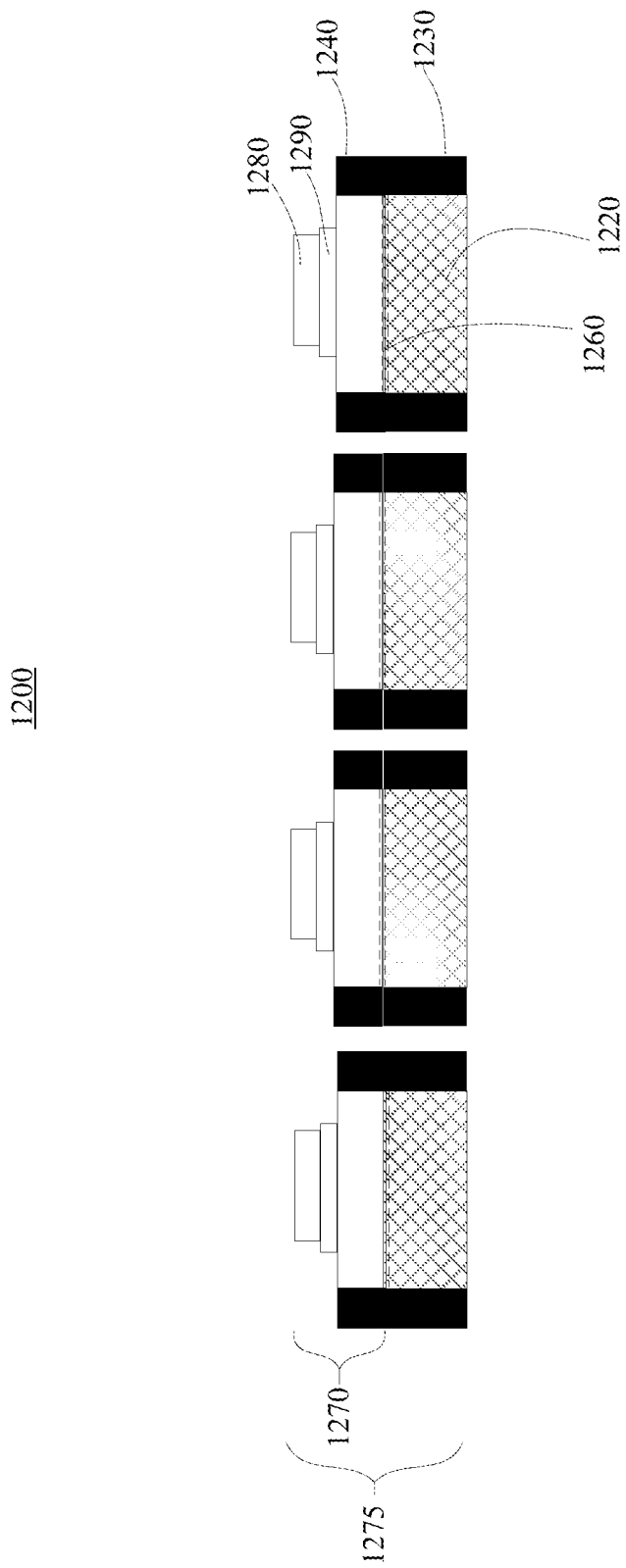
FIG. 1D is a cross-section view diagram of an LED array.

FIG. 1D shows an example pixel array 1200 manufactured in accordance with the techniques disclosed herein may include light-emitting devices 1270 that include a GaN layer 1250, active region 1290, solder 1280, and pattern sapphire substrate (PSS) pattern 1260. Wavelength converting layers 1220 may be disposed onto the light emitting devices 1270 in accordance with the techniques disclosed herein to create pixels 1275.

Optical isolation materials 1230 may be applied to the wavelength converting layer 1220. A wavelength converting layer may be mounted onto a GaN layer 1250 via a pattern sapphire substrate (PSS) pattern 1260. The GaN layer 1250 may be bonded to or grown over an active region 1290 and the light-emitting device 1270 may include a solder 1280.

Optical isolator material 1240 may also be applied to the sidewalls of the GaN layer 1250.

As an example, the pixels 1275 of FIG. 1D may correspond to the pixels 111 of FIG. 1*b*. When the pixels 111 or 1275 are activated, the respective active regions 1290 of the pixels may generate a light. The light may pass through the wavelength converting layer 1220 and may substantially be emitted from the surface of the wavelength converting layer 1220.

Figure 1E:
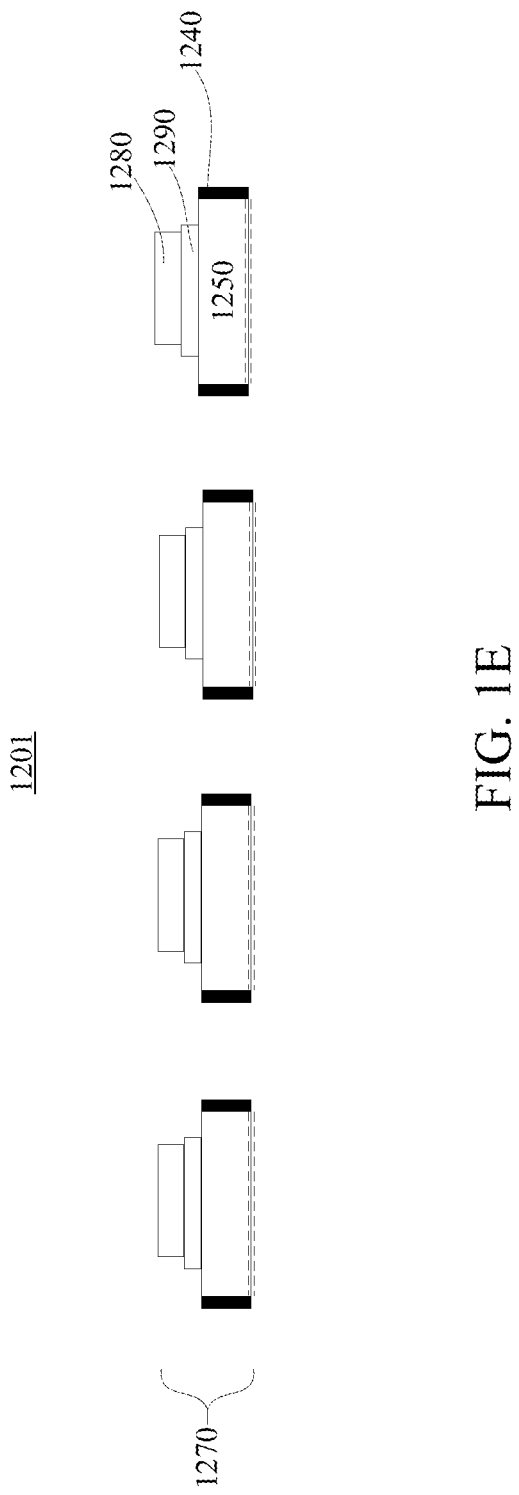
FIG. 1E is a cross-section view diagram of a light emitting devices.

FIG. 1E shows components of the pixel array of FIG. 1D prior to the wavelength converting layer 1220 being placed on the light emitting devices 1270.

Figure 1F:
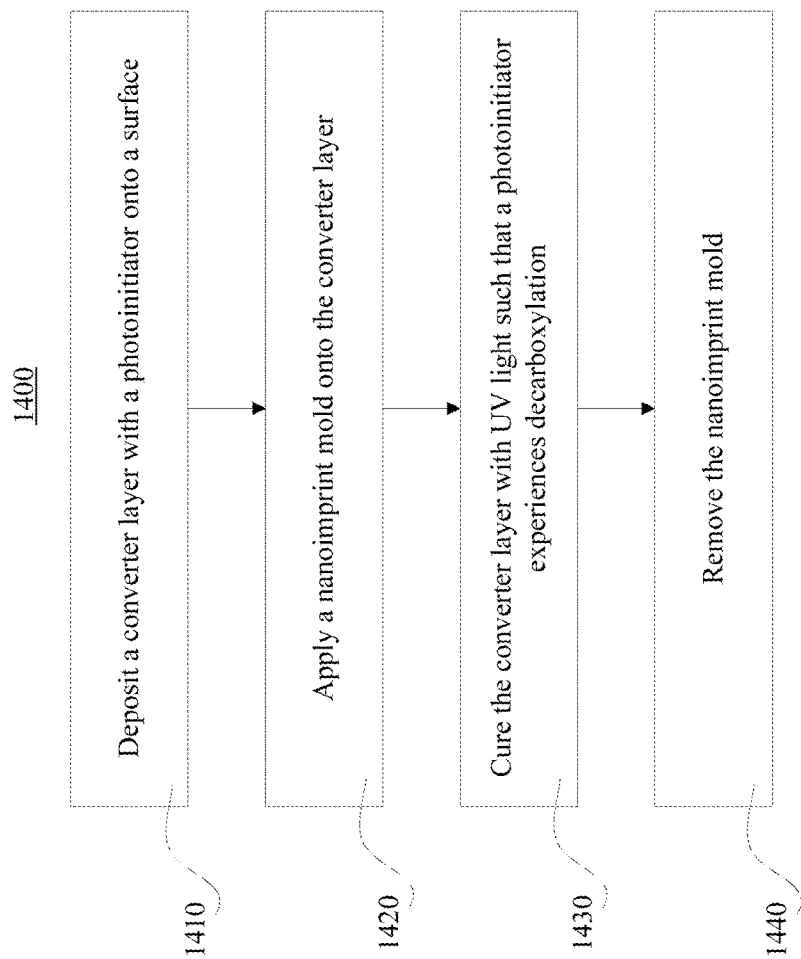
FIG. 1F is a method to generate wavelength converting layer segments.

FIG. 1F shows a method 1400 for generating a wavelength converting layer with a sol-gel or siloxane binder. As shown at step 1410 a wavelength converting layer may be deposited onto a surface. The surface may be any applicable surface such as a support surface such as a glass support surface, a tape such as a stretchable tape, a blue tape, a white tape, a UV tape, or any other surface configured to hold the wavelength converting layer. The surface may contain walls to hold the wavelength converting layer material.

The wavelength converting layer may include a plurality of optically isolating particles such as, but not limited to phosphor grains with or without activation from rare earth ions, zinc barium borate, aluminum nitride, aluminum oxynitride (AlON), barium sulfate, barium titanate, calcium titanate, cubic zirconia, diamond, gadolinium gallium garnet (GGG), lead lanthanum zirconate titanate (PLZT), lead zirconate titanate (PZT), sapphire, silicon aluminum oxynitride (SiAlON), silicon carbide, silicon oxynitride (SiON), strontium titanate, titanium oxide, yttrium aluminum garnet (YAG), zinc selenide, zinc sulfide, and zinc telluride, diamond, silicon carbide (SiC), single crystal aluminum nitride (AlN), gallium nitride (GaN), or aluminum gallium nitride (AlGaN) or any transparent, translucent, or scattering ceramic, optical glass, high index glass, sapphire, alumina, III-V semiconductors such as gallium phosphide, II-VI semiconductors such as zinc sulfide, zinc selenide, and zinc telluride, group IV semiconductors and compounds, metal oxides, metal fluorides, an oxide of any of the following: aluminum, antimony, arsenic, bismuth, calcium, copper, gallium, germanium, lanthanum, lead, niobium, phosphorus, tellurium, thallium, titanium, tungsten, zinc, or zirconium, polycrystalline aluminum oxide (transparent alumina), aluminum oxynitride (AlON), cubic zirconia (CZ), gadolinium gallium garnet (GGG), gallium phosphide (GaP), lead zirconate titanate (PZT), silicon aluminum oxynitride (SiAlON), silicon carbide (SiC), silicon oxynitride (SiON), strontium titanate, yttrium aluminum garnet (YAG), zinc sulfide (ZnS), spinel, Schott glass LaFN21, LaSFN35, LaF2, LaF3, LaF10, NZK7, NLAF21, LaSFN18, SF59, or LaSF3, Ohara glass SLAM60 or SLAH51, and may comprise nitride luminescent material, garnet luminescent material, orthosilicate luminescent material, SiAlON luminescent material, aluminate luminescent material, oxynitride luminescent material, halogenide luminescent material, oxyhalogenide luminescent material, sulfide luminescent material and/or oxysulfide luminescent material, luminescent quantum dots comprising core materials chosen from cadmium sulfide, cadmium selenide, zinc sulfide, zinc selenide, and may be chosen form $SrLiAl_3N_4$:Eu (II) (strontium-lithium-aluminum nitride: europium (II)) class, Eu(II) doped nitride phosphors like $(Ba,Sr,Ca)2Si5-xAlxOxN8$:Eu, $(Sr,Ca)SiAlN3$:Eu or $SrLiAl3N4$:Eu, or any combination thereof.

The wavelength converting layer may include binder material such that the binder material is either siloxane material or sol-gel material or hybrid combinations of sol-gel and siloxane, as well as polysilazane precursor polymers in combination with siloxanes. Siloxane material and/or sol-gel material may be as a binder as such material may be configured to remain functional under the high flux and temperature requirements of LED pixels and pixel arrays.

Figure 1G:
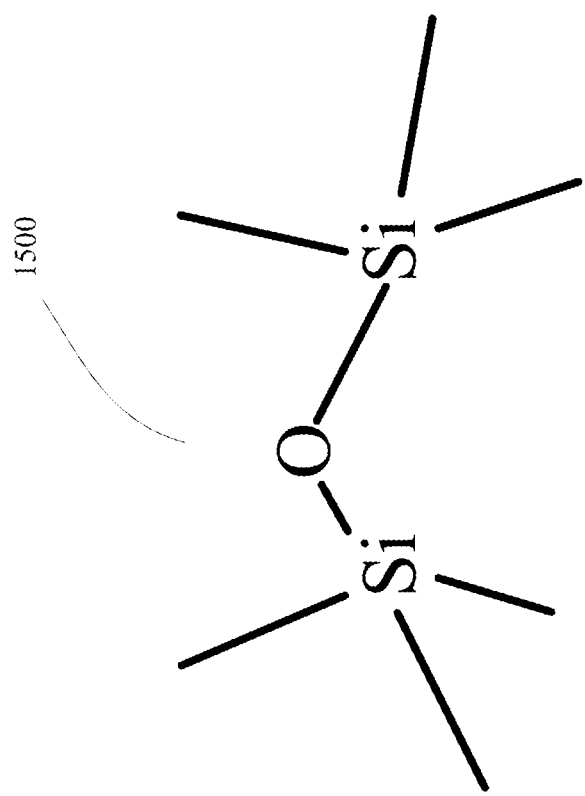
FIG. 1G is a diagram of a siloxane compound.

Siloxane material may be siloxane polymer where siloxane is a functional group in organosilicon chemistry with the Si—O—Si linkage, as shown in FIG. 1G via compound 1500. Parent siloxanes may include oligomeric and polymeric hydrides with the formulae $H(OSiH_2)_nOH$ and $(OSiH_2)_n$. Siloxanes may also include branched compounds, the defining feature of which may be that each pair of silicon centres is separated by one oxygen atom. Siloxane material may adopt structures expected for linked tetrahedral ("sp$^3$-like") centers. The Si—O bond may be 1.64 Å (vs Si—C distance of 1.92 Å) and the Si—O—Si angle may be open at 142.5°. Siloxanes may have low barriers for rotation about the Si—O bonds as a consequence of low steric hindrance.

A siloxane binder may be formed via a condensation reaction such that molecules join together by losing small molecules as byproducts such as water or methanol. Alternatively or in addition, a siloxane binder may be formed via ring-opening polymerization such that the terminal end of a polymer chain acts as a reactive center where further cyclic monomers can react by opening its ring system and form a longer polymer chain. The condensation reaction and/or the ring-opening polymerization may be considered a form of chain-growth polymerization.

A sol-gel binder may be created via a sol-gel process using a wet-chemical technique. In such a process a solution may evolve gradually towards the formation of a gel-like network containing both a liquid and a solid phase. Precursors such as metal alkoxides and metal chlorides, which undergo hydrolysis and polycondensation reactions, may be used during the sol-gel process. The solution (sol) may contain colloids and a colloidal dispersion may be a solid-liquid and/or liquid/liquid mixture, which contains solid particles, dispersed in various degrees in a liquid medium. A sol-gel binder may be formed via a condensation reaction such that molecules join together by losing small molecules as byproducts such as water or methanol. Precursor polymers such as polysilazanes and polysilazane-siloxane hybrid materials may also be used as binders. Polysilzanes are precursor polymers containing the —HN—Si motif which is highly reactive with silanols (Si—OH) and alcohols (C—OH) to form siloxane bonds (Si—O—) with elimination of ammonia (NH3). Polysilazane-based precursor liquids are commercially available as "Spin-On-Glass" materials. They are typically used to cast SiO2 dielectric films.

Figure 1H:
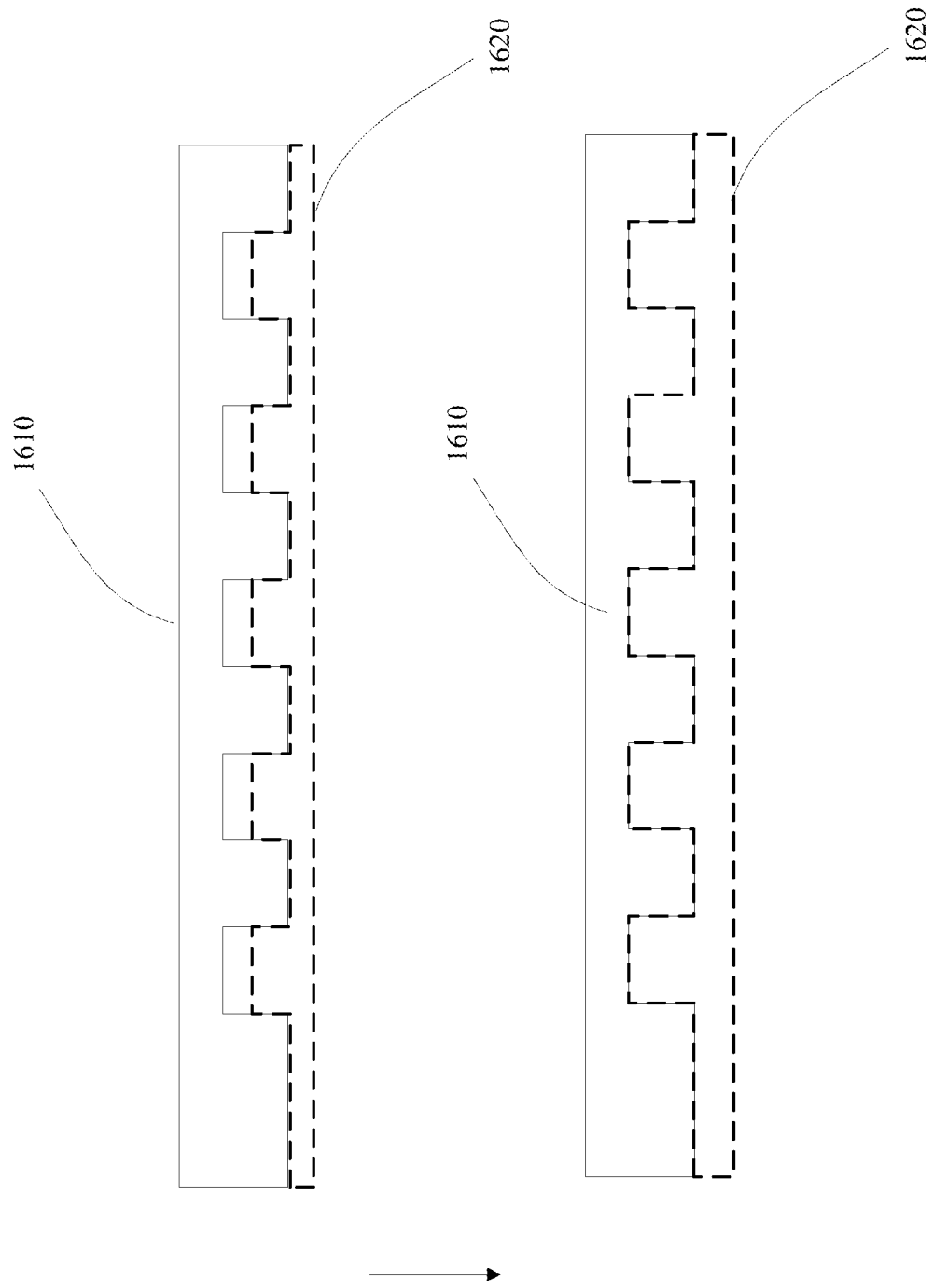
FIG. 1H is a diagram of a nanoimprint lithography mold on converter material.

The binder to bind a wavelength converting layer may need to experience rapid curing and low volatility in order facilitate a nanoimprint lithography (NIL) process as disclosed herein. Accordingly, the wavelength converting layer may contain a photoinitiator, and the photoinitiator may be used to catalyze the curing process of the binder. A NIL process may be applied to the wavelength converting layer to segment the wavelength converting layer into wavelength converting layer segments that can be applied to light emitting devices. As shown in FIG. 1F, at step 1420, a NIL mold may be applied to the wavelength converting layer. FIG. 1H illustrates a cross-sectional view of a NIL mold 1610 being applied to a wavelength converting layer 1620. As shown, the NIL mold 1610 may be deposited such that wavelength converting layer 1620 changes its form to that of the mold 1610. It should be noted that the space between the teeth of the mold 1610 may correspond to the spacing required to place wavelength converting layer segments onto spaced light emitting devices.

At step 1430 of FIG. 1F, the wavelength converting layer may be cured. The curing may be conducted using a UV radiation or a combination of UV radiation and a thermal cure. All or portions of the wavelength converting layer may be exposed to UV radiation such that those sections can be cured. UV light may be emitted onto the wavelength converting layer from any applicable direction and may be applied through the NIL mold if the mold is fully or partially transparent.

The UV light may produce a rapid curing process via the use of a catalyst to expedite the reactions required to complete the cure. The UV light may emit onto a photoinitiator contained in the wavelength converting layer and the photoinitiator may react with the UV light. The photoinitiator may be, for example, a salt created by interactions of bases with an acid that is capable of undergoing photodecarboxylation. The photoinitiator may be a salt compound created when an acid and a base pair up to form a neutral species.

The photoinitiator may be configured to undergo the photodecarboxylation process when UV light is emitted onto the photoinitiator. A compound contained in the photoinitiator, such as an organic acid, may react with the light such that it decomposes by losing carbon dioxide ($CO_2$). Such decarboxylation may effectively remove the acid from the photoinitiator and a byproduct of the decarboxylation may be, for example, a super base along with other non-acidic residues. The super base may be, for example, 1,5-diazabicyclo [5.4.0]undec-5-ene (DBU), 1,5,7-triazabicyclo [4.4.0] dec-5-ene (TBD). The super base may have properties such that it seeks other molecules to park excess electrons which may lead to catalytic action on reactive chain ends or crosslinkable substrates of the sol-gel or siloxane binder.

The super base or other non-acidic residues may be removed from the wavelength converting layer by evaporation or further decomposition during a thermal cure or postbake.

As shown at step 1440 of FIG. 1F, the nanoimprint mold may be removed from the wavelength converting layer as the wavelength converting layer may contain wavelength converting layer segments that are shaped during the curing process. At step 1450 of FIG. 1F wavelength converting layer segments may be sized and placed such that they can be attached to an array of light emitting devices such as the array of light emitting devices 1201 of FIG. 1E to produce the pixel array 1200 of FIG. 1D. It will be noted that a separation step may be required to separate the wavelength converting layer to form the wavelength converting layer segments and may include any applicable such as sawing, etching, laser etching, or the like. It will also be noted that the wavelength converting layer segments may be attached to light emitting devices via any applicable transfer method such as by using a transfer tape, transfer substrate, or the like.

Figure 1I:
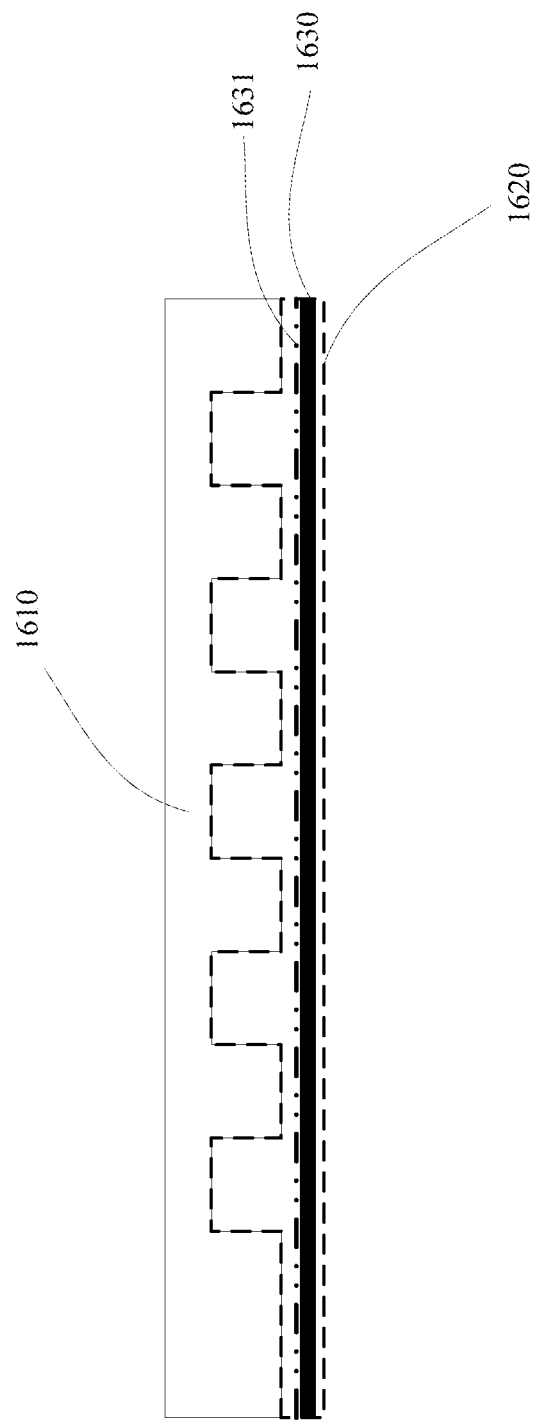
FIG. 1I is a diagram of an intermediate step of the nanoimprint lithography mold on converter material of FIG. 1H.

FIG. 1I shows an intermediate step of the cross-sectional view of a NIL mold 1610 being applied to a wavelength converting layer 1620, of FIG. 1I. As shown, the wavelength converting layer 1620 may be partially formed such that wavelength converting layer 1620 corresponds to the portion that is cured with, for example, via UV light such that the photoinitiator experiences decarboxylation. A second wavelength converting layer 1630 may be partially formed such that it may be experiencing decarboxylation. A byproduct of super base 1631 may remain at this intermediate step, as shown.

According to an implementation of the disclosed subject matter, direct printing using ink jet or similar printing machines may be used to deposit a wavelength converting layer onto light emitting devices. A pattern may be generated on a releasable substrate such as a photolith or imprint litho. Atomic layer deposition (ALD) may be used to pattern a layer using, for example, liftoff to remove the undesirable areas. Kateeva or similar printers can be used to print each layer with, for example, a TiOx layer at the below a phosphor layer. Notably, such direct printing may require the phosphor particles to be significantly smaller than space made available via the nozzles. Accordingly, 1 um or less phosphor particle size may be used for such a deposition.

Figure 1K:
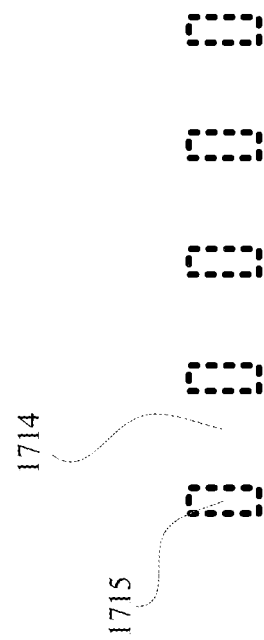
FIG. 1K is a cross section view of the mesh of FIG. 1J.
Figure 1J:
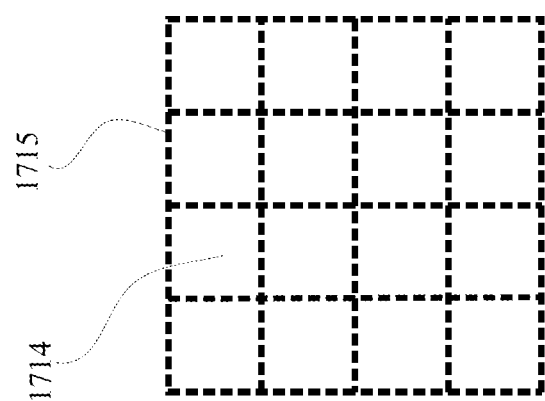
FIG. 1J is a diagram of a top view of a mesh.

According to an implementation of the disclosed subject matter, FIG. 1J shows a top view and FIG. 1K shows a cross-sectional view of a mesh wall 1715 that may be generated to provide a structure for a wavelength converting layers 1220 of FIG. 1D when manufacturing the pixel array of FIG. 1D. The mesh wall 1715 may contain cavities 1714 with space that correspond to the space between light emitting devices 1270 of FIG. 1E such that the mesh wall is spaced for the cavities 1714 to align with the light emitting devices 1270 of FIG. 1E prior to the attaching the wavelength converting layers 1220 of FIG. 1D. The mesh walls may be formed using a nanoimprint (NIL) lithography process or a contact print process. A NIL process may be used to generate the mesh walls by depositing a mesh wall material onto a surface and applying a nanoimprint mold onto the material. The mesh wall material may be cured using thermal curing or using UV light and the nanoimprint mold may be removed from the mesh wall material. The resulting mesh wall may be deposited onto the pixel array to create supports for the deposition of a wavelength converting layers 1220 of FIG. 1D. Alternatively, the mesh film may be generated contact printing photonic columns with, for example, sacrificial PMMA or with UV curable material.

Figure 2A:
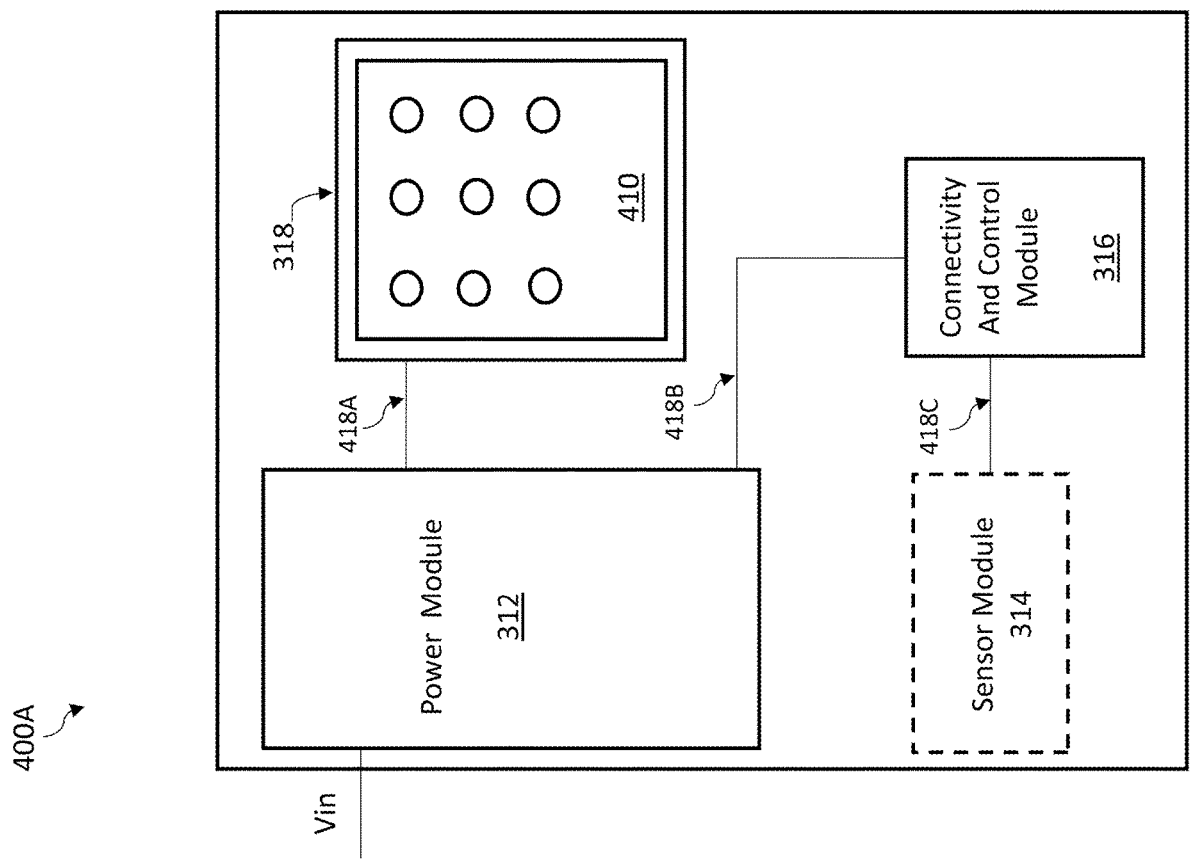
FIG. 2A is a top view of the electronics board with LED array attached to the substrate at the LED device attach region in one embodiment.

FIG. 2A is a top view of an electronics board with an LED array 410 attached to a substrate at the LED device attach region 318 in one embodiment. The electronics board together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 2A, the connectivity and control module 316 receives sensor signals from the sensor module 314 over trace 418C. The pixels in LED array 410 may be generated in accordance with the steps outlined in FIG. 1F and may be based on the techniques disclosed herein related to FIGS. 1G-I.

Figure 2B:
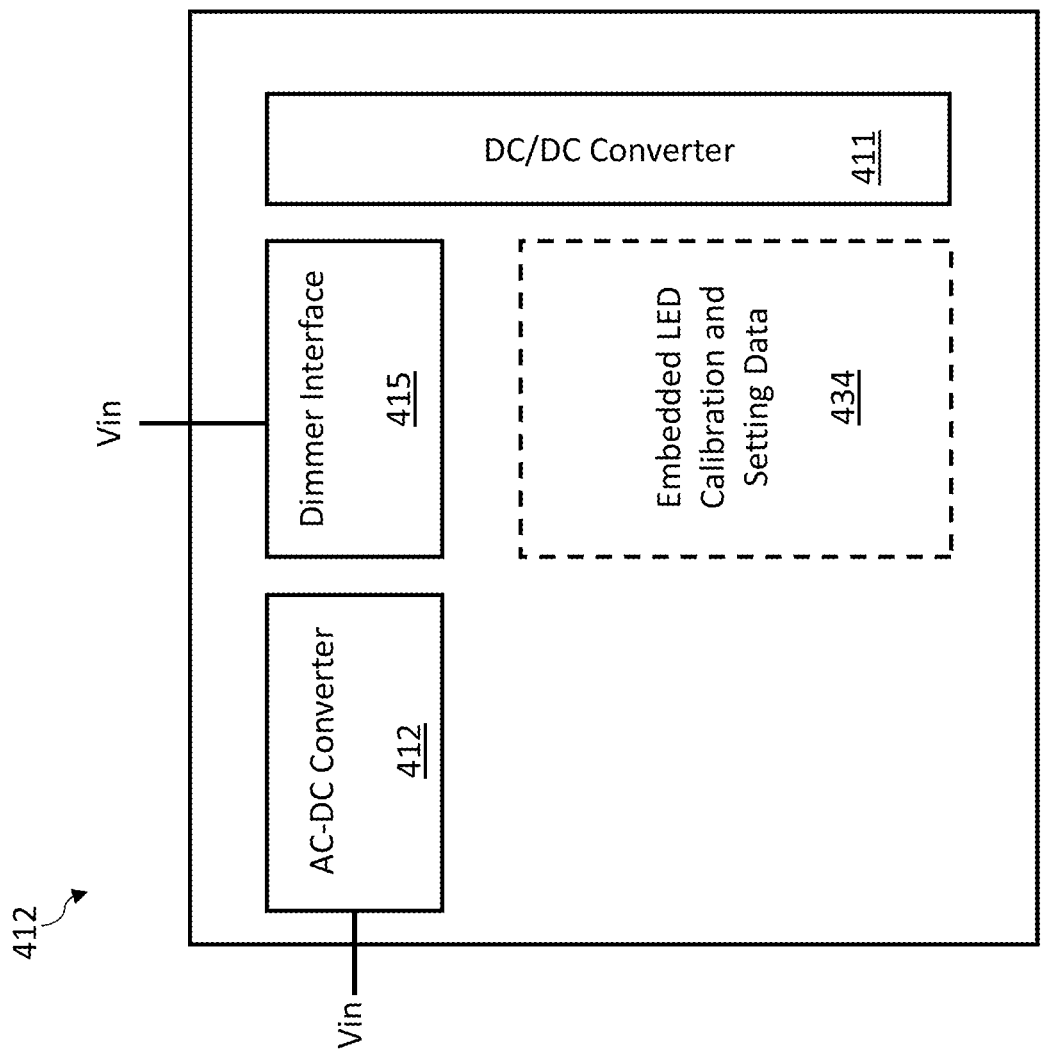
FIG. 2B is a diagram of one embodiment of a two channel integrated LED lighting system with electronic components mounted on two surfaces of a circuit board.

FIG. 2B illustrates one embodiment of a two channel integrated LED lighting system with electronic components mounted on two surfaces of a circuit board 499. As shown in FIG. 2B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels such as first channel 411A and second channel 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 4111B, respectively. Although the embodiment shown in FIG. 2B does not include a sensor module (as described in FIG. 2A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown). As disclosed herein, the pixels in LED array 410 may be generated in accordance with the steps outlined in FIG. 1F and may be based on the techniques disclosed herein related to FIGS. 1G-I.

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 2C:
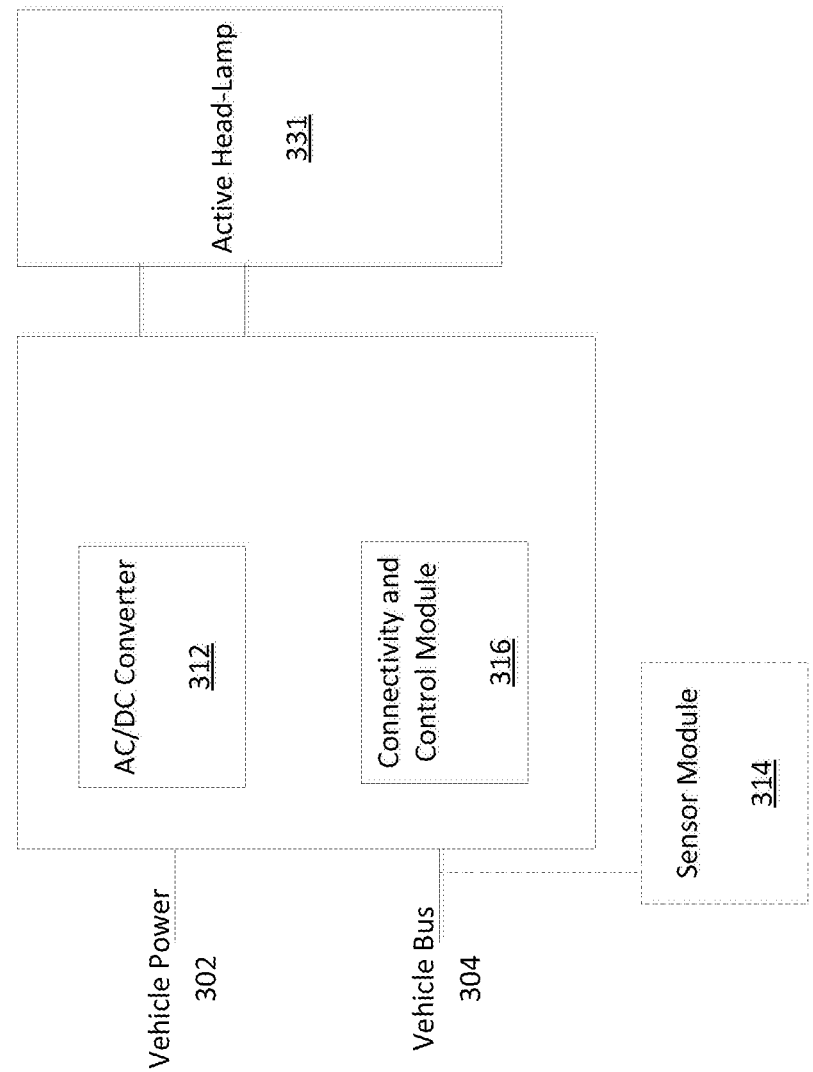
FIG. 2C is an example vehicle headlamp system.

FIG. 2C shows an example vehicle headlamp system 300 including a vehicle power 302 including a data bus 304. A sensor module 307 may be connected to the data bus 304 to provide data related to environment conditions (e.g. ambient light conditions, temperature, time, rain, fog, etc.), vehicle condition (parked, in-motion, speed, direction), presence/position of other vehicles, pedestrians, objects, or the like. The sensor module 307 may be similar to or the same as the sensor module 314 of FIG. 2A. AC/DC Converter 305 may be connected to the vehicle power 302.

The power module 312 (AC/DC converter) of FIG. 2C may be the same as or similar to the AC/DC converter 412 of FIG. 2B and may receive AC power from the vehicle power 302. It may convert the AC power to DC power as described in FIG. 2B for AC-DC converter 412. The vehicle head lamp system 300 may include an active head lamp 331 which receives one or more inputs provided by or based on the AC/DC converter 305, connectivity and control module 306, and/or sensor module 307. As an example, the sensor module 307 may detect the presence of a pedestrian such that the pedestrian is not well lit, which may reduce the likelihood that a driver sees the pedestrian. Based on such sensor input, the connectivity and control module 306 may output data to the active head lamp 331 using power provided from the AC/DC converter 305 such that the output data activates a subset of LEDs in an LED array contained within active head lamp 331. The subset of LEDs in the LED array, when activated, may emit light in the direction where the sensor module 307 sensed the presence of the pedestrian. These subset of LEDs may be deactivated or their light beam direction may otherwise be modified after the sensor module 207 provides updated data confirming that the pedestrian is no longer in a path of the vehicle that includes vehicle head lamp system. The pixels in an LED array in the active head lamp 331 may be generated in accordance with the steps outlined in FIG. 1F and may be based on the techniques disclosed herein related to FIGS. 1G-I.

Figure 3:
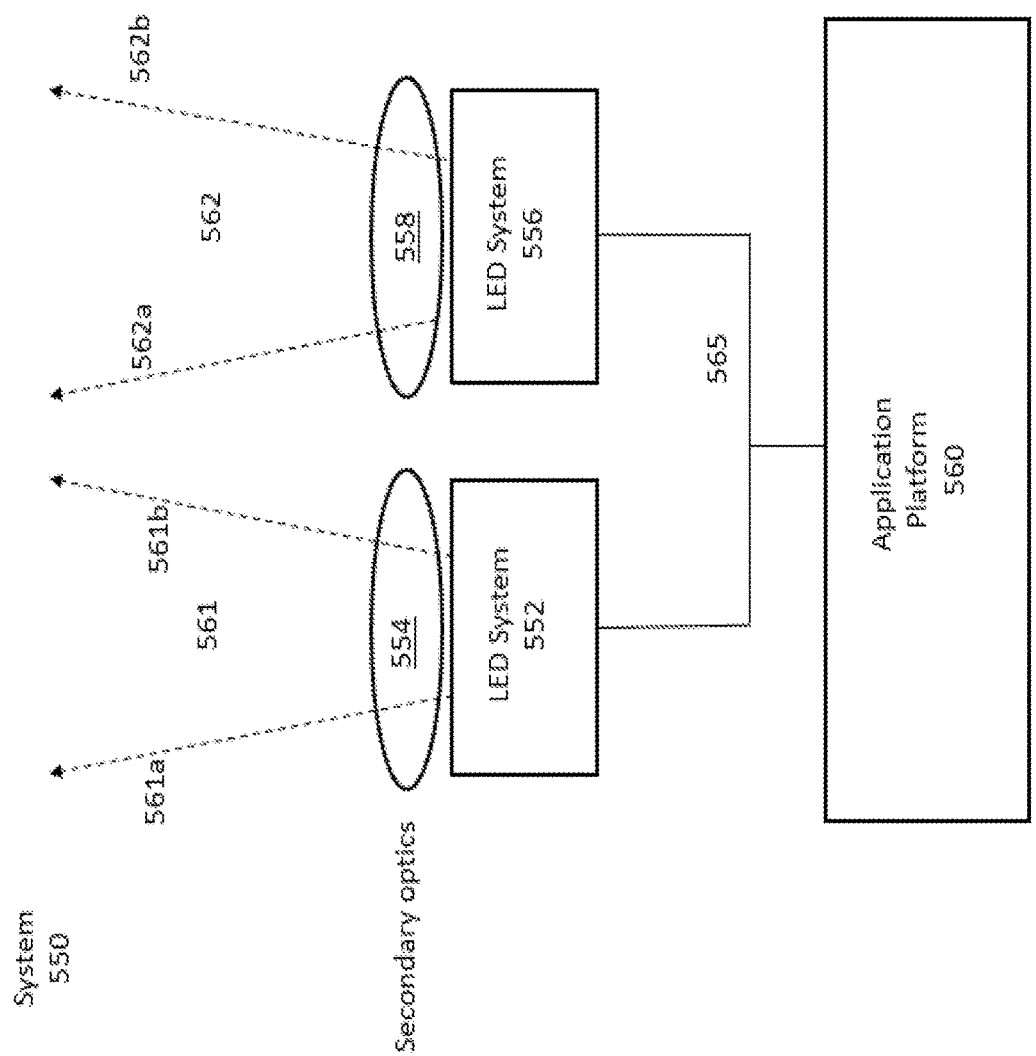
FIG. 3 shows an example illumination system.

FIG. 3 shows an example system 550 which includes an application platform 560, LED systems 552 and 556, and optics 554 and 558. The pixels in LED systems 552 and 556 may be generated in accordance with the steps outlined in FIG. 1F and may be based on the techniques disclosed herein related to FIGS. 1G-I. The LED System 552 produces light beams 561 shown between arrows 561a and 561b. The LED System 556 may produce light beams 562 between arrows 562a and 562b. In the embodiment shown in FIG. 3, the light emitted from LED System 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 2A and vehicle head lamp system 300 shown in FIG. 2C illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560. Alternatively or in addition, as shown in the LED system 400 of FIG. 2A, each LED System 552 and 556 may include its own sensor module, connectivity and control module, power module, and/or LED devices.

In embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related to a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors (e.g., similar to sensors module 314 of FIG. 2A and 307 of FIG. 2C) that identify portions of a scene (roadway, pedestrian crossing, etc.) that require illumination.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

The invention claimed is:

1. A wavelength converting structure comprising:
   a wavelength converter layer comprising a phosphor, a curable material, and a photoinitiator capable of catalyzing the curing of the curable material.

2. The wavelength converting structure of claim 1, wherein the curable material comprises one or more of a siloxane material, a polysilazane, or a sol-gel material.

3. The wavelength converting structure of claim 1, wherein the photoinitiator is a salt.

4. The wavelength converting structure of claim 1, wherein the photoinitiator can undergo decarboxylation.

5. The wavelength converting structure of claim 1, wherein the photoinitiator can undergo decarboxylation to produce a super base.

6. A wavelength converting structure comprising:
   a mesh having intersecting walls defining cavities; and
   a plurality of wavelength converting elements situated within the cavities forming an array of wavelength converting elements; each wavelength converting element in contact with the mesh; each wavelength converting element comprising a phosphor, a curable material, and a photoinitiator capable of catalyzing the curing of the curable material.

7. The wavelength converting structure of claim 6, wherein the wavelength converting elements have widths of 100 microns or less and adjacent wavelength converting elements are spaced apart by 20 microns or less.

8. The wavelength converting structure of claim 6, wherein the curable material comprises one or more of a siloxane material, a polysilazane, or a sol-gel material.

9. The wavelength converting structure of claim 6, wherein the curable material comprises a siloxane material.

10. The wavelength converting structure of claim 6, wherein the curable material comprises a sol-gel material.

11. The wavelength converting structure of claim 6, wherein the photoinitiator is a salt.

12. The wavelength converting structure of claim 6, wherein the photoinitiator can undergo decarboxylation.

13. The wavelength converting structure of claim 6, wherein the photoinitiator can undergo decarboxylation to produce a super base.

14. The wavelength converting structure of claim 6, wherein the mesh comprises a second curable material, and a second photoinitiator capable of catalyzing the curing of the second curable material.

15. The wavelength converting structure of claim 14, wherein the second curable material comprises one or more of a siloxane material, a polysilazane, or a sol-gel material.

16. The wavelength converting structure of claim 14, wherein the second photoinitiator can undergo decarboxylation.

17. The wavelength converting structure of claim 14, wherein the second photoinitiator is a salt.

18. The wavelength converting structure of claim 14, wherein the second photoinitiator can undergo decarboxylation upon exposure to UV light.

19. A structure comprising:
   a mesh having intersecting walls defining cavities, the mesh comprising a decarboxylated photoinitiator and a cured binder, the cavities having widths of 100 microns or less, the walls having widths of 20 microns or less.

20. The structure of claim 19, wherein the cured binder comprises one or more of a cured siloxane material, a cured polysilazane, or a cured sol-gel material.

* * * * *